United States Patent [19]

Pawlowski

[11] Patent Number: 5,729,497
[45] Date of Patent: Mar. 17, 1998

[54] METHOD OF USING PARITY AND ECC BITS TO INCREASE THE YIELD OF NON-PARITY ECC DEVICES

[75] Inventor: J. Thomas Pawlowski, Boise, Id.

[73] Assignee: Micron Technology Inc., Boise, Id.

[21] Appl. No.: 607,704

[22] Filed: Feb. 27, 1996

[51] Int. Cl.$^6$ ................................................ G11C 29/00
[52] U.S. Cl. ...................... 365/200; 365/225.7; 365/201
[58] Field of Search ................................. 365/200, 201, 365/225.7; 371/10.2

[56] References Cited

U.S. PATENT DOCUMENTS

| | | | |
|---|---|---|---|
| 5,228,132 | 7/1993 | Neal et al. | 365/230.03 |
| 5,287,311 | 2/1994 | Tso et al. | 365/200 |
| 5,557,573 | 9/1996 | McClure | 365/201 |

OTHER PUBLICATIONS

Blanchard et al., "Automatic RAM Repair of Single bit Hard Errors Using Spare Bits", IBM Technical Disclosure Bulletin, vol. 27 No. 1A, pp. 363–364, Jun. 1984.

*Primary Examiner*—David C. Nelms
*Assistant Examiner*—Huan Hoang
*Attorney, Agent, or Firm*—Kirkpatrick & Lockhart LLP

[57] ABSTRACT

A method of using non-data bits of the memory device as data bits is comprised of the steps of determining which bits in the memory device are nonfunctional and which bits are functional. If any of the data bits is nonfunctional, the second step of the method is to connect a non-data bit to a data bit line. The second step may be carried out while the memory device is being bonded to a lead frame or during the external routing of the output pads of the memory device on a printed circuit board. The method of the present invention may also be carried out by providing a plurality of fusible links between the memory cells of the memory device and the memory devices output pads. The fusible links may be opened in a manner so that each output pad is connected to a functional bit.

21 Claims, 7 Drawing Sheets

FIG. 5

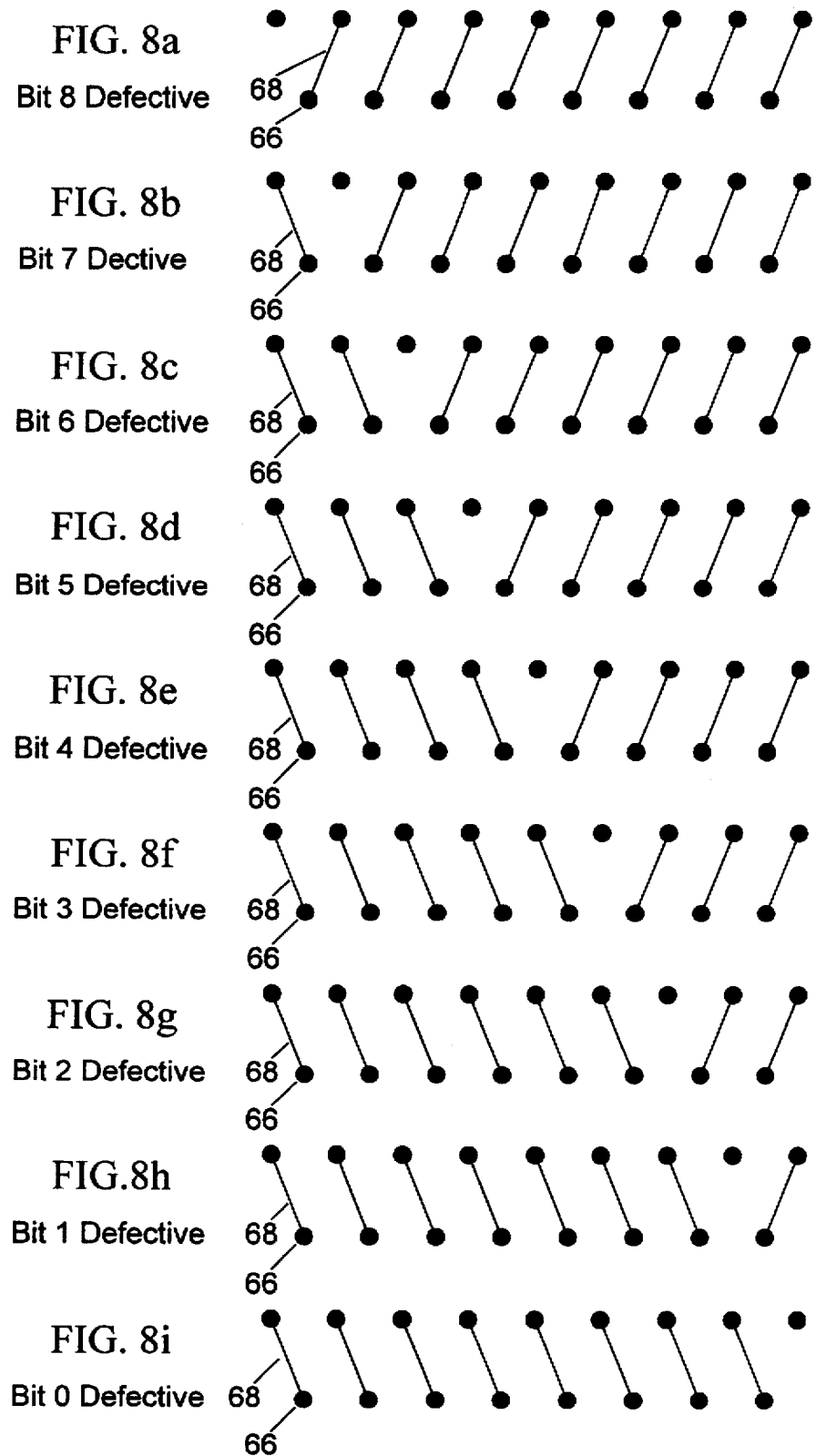
FIG. 8a Bit 8 Defective
FIG. 8b Bit 7 Dective
FIG. 8c Bit 6 Defective
FIG. 8d Bit 5 Defective
FIG. 8e Bit 4 Defective
FIG. 8f Bit 3 Defective
FIG. 8g Bit 2 Defective
FIG. 8h Bit 1 Defective
FIG. 8i Bit 0 Defective

METHOD OF USING PARITY AND ECC BITS TO INCREASE THE YIELD OF NON-PARITY ECC DEVICES

BACKGROUND OF THE INVENTION

1. Field the Invention

The present invention is directed generally to techniques for fabricating memory devices and, more particularly, to techniques for increasing the yields of such memory devices.

2. Description of the Background

Integrated circuit memories such as random access memories (RAM) generally contain a two dimensional array of storage cells arranged in rows and columns. A common architecture connects all cells in a row to a common row line, often referred to as the "word line" and all cells in a column to a common column line often called the "digit line".

Cells in the array are identified by a binary row address and a binary column address. A row decoder responds to the binary row address and activates one row line for read or write access. A column decoder responds to the binary column address and activates read or write circuitry, conventionally a sense amplifier connected across a pair of complementary digit lines, associated with one column.

Integrated circuit memories are also generally binary logic circuits in which information is stored and transferred as logic states (conventionally, voltages) representing complementary logic values that are alternately referred to as "on" and "off", "true" and "false", "logic 1" and "logic 0", or logic "high" and logic "low". A voltage of 5 volts may represent the logic 1 state while a voltage of zero volts may represent the logic 0 state. Because of the constraints of resistance, capacitance, etc., the individual cells are usually at an intermediate voltage. Thus, subcircuits are associated with the digit lines of integrated circuit memories to pull the intermediate logic 1 voltage up to, or in excess of the full logic 1 voltage, for example, 5 volts. Other subcircuits pull the intermediate logic 0 down to, or below the logic 0 voltage, for example 0 volts. A common architecture employs a P-sense amplifier for the pull up subcircuit and an N-sense amplifier as the pull down subcircuit.

The rows and columns of cells making up the array dictate the storage capacity of the device. For example, a device having 131,072 rows and eight columns is capable of storing 131,072 eight-bit bytes. It is known in the art to provide extra bits per byte so that information in addition to data may be stored. Such information may include a parity check bit or an error check and correction (ECC) bit. Such parity bits and ECC bits are used in the art to provide information regarding the validity of the data and, in certain circumstances, the capability of correcting errors in the data. In typical systems employing parity bits and ECC bits, a certain percentage of memory devices must have the capacity to accommodate those extra bits. Typically, that means that the memory device must provide an extra bit of memory for every eight bits. Applications not requiring parity bits or ECC bits do not require the extra bit for every eight bits. For applications which require the extra bit, either additional memory devices must be added to the system, or wider devices need to be manufactured. If wider devices are required, the choice must be made whether to employ both a wider device and a narrower device, e.g., a X32 and X36 memory, or just the wider device, e.g., an X36 memory, and waste the extra bits when using the device in a non-parity application. Both options are costly in terms of non-recurring and recurring costs. Thus, the need exists for a method for utilizing the extra bits in a device when the device is used in a non-parity and non-ECC application.

SUMMARY OF THE INVENTION

The present invention is directed to a method of using non-data bits of a memory device as data bits. The method is comprised of the steps of determining which bits in the memory device are nonfunctional and which bits are functional. If any of the data bits are nonfunctional, the second step of the method is to connect a non-data bit to a data bit line. The second step may be carried out while the memory device is being bonded to a lead frame or during the external routing of the output pads of the memory device on a printed circuit board (PCB). By implementing the method of the present invention, a device intended to be used for a parity or ECC application, but which has been found to have defective data bits, can still be used as a conventional memory device by using the parity or ECC bit as a substitute for a data bit.

Another embodiment of the method of the present invention can be employed where the memory device has been modified such that the data cells are connected to the input/output pads of the device through fusible links. After determining which data bits in the memory device are functional and which are nonfunctional, any nonfunctional data bits can be disconnected from its associated input/output pad by opening the fusible link. In that manner, the input/output pads are ultimately connected only to functional data bits or non-data bits. Anti-fuses could also be used.

The present invention is also directed to a memory device having fusible links or anti-fuses located in the output stage of the sense amplifiers or downstream thereof.

The method of the present invention, and a memory device employing links as disclosed by the present invention, enables the yield of memory devices to be increased without requiring any substantial changes in fabrication techniques. Those, and other advantages and benefits of the present invention, will become apparent from the Description Of The Preferred Embodiment hereinbelow.

BRIEF DESCRIPTION OF THE DRAWINGS

For the present invention to be clearly understood and readily practiced, the present invention will be described in conjunction with the following figures wherein:

FIGS. 8a–8i illustrate repairs using fusible links according to the teachings of the present invention.

DESCRIPTION OF THE PREFERRED EMBODIMENT

Figure 1A:
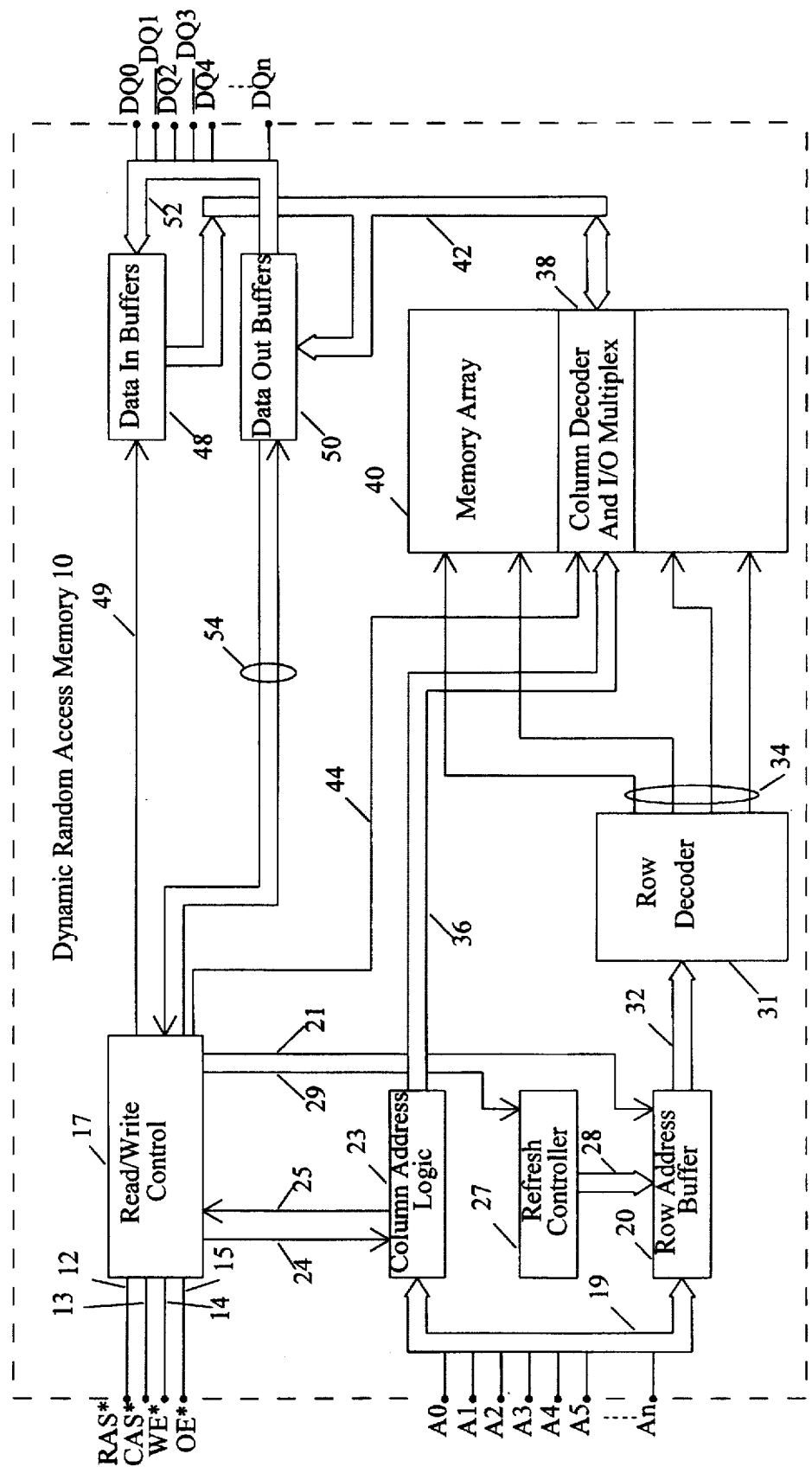
FIG. 1a is a functional block diagram of a random access memory device not employing parity bits.

FIG. 1a is a functional block diagram of a dynamic random access memory device 10 of the type with which the present invention may be employed. The present invention, however, is not limited to memory device 10 and may be used with any of various types of memory devices as will become apparent to those of ordinary skill in the art. Memory device 10 is disclosed merely for purposes of illustration and not limitation.

Memory device 10 is controlled by binary control signals 12–15 input from the device pads to a read/write control 17. Control signals 12–15 are conventionally known by names corresponding to the primary function of each signal. Signal 12 is row address strobe (RAS*). Signal 13 is column address strobe (CAS*). Signal 14 is write enable (WE*). Signal 15 is output enable (OE*). When RAS, falls, the state of an address bus 19 is latched in a row address buffer 20 in response to control signals 21 produced by read/write control 17. When CAS* falls, the state of the address bus 19 is latched in column address logic 23 in response to control signals 24 produced by read/write control 17. Read/Write control 17 also responds to changes in the column address as indicated by address change signals 25 for improved read access time as in page mode.

Several read and write modes of operation are conducted by read/write control 17 in response to combinations of control signals 12–15 and address change signals 25. Refresh mode is one such operation conducted when RAS* is pulsed while CAS* is low. During refresh mode, a refresh controller 27 generates a refresh signal for a row address bus 28 in response to control signals 29. The row address buffer 20 is connected to a row decoder 31 by a second row address bus 32. The second row address bus 32, in response to row address buffer 20, presents either the address latched when RAS, falls or the refresh row address, depending on the mode of operation.

The row decoder 31 asserts a row select signal on one or more row activating signal lines 34. The column address logic 23 presents on a binary column address bus 36 an address to column decoder 38 which is a part of a memory array 40. The column decoder 38 asserts a signal for selecting one or more columns, selecting a pair of I/O lines, and coupling those lines to global I/O signals 42. Thus, a single memory cell (not shown) of memory array 40 is selected for read and write operations according to the intersection of a decoded row signal and a decoded column signal.

Sense amplifiers (not shown) within array 40 perform several functions responsive to control signals 44 shown generally coupled to memory array 40. In a refresh mode of operation, the content of a memory cell is refreshed by the sense amplifiers. When cell contents are to be overwritten in a write operation, the sense amplifiers establish proper cell contents in response to write data signals available from Data In Buffers 48 through global I/O lines 42. In read operations, cell contents are amplified and presented to Data Out Buffers 50 through signals on global I/O lines 42.

Data In Buffers 48 receive control signals 49 from read/write control 17. Data In Buffers 48 are driven by a data bus 52 which comprises several individual data lines which terminate in pads labeled DQ0 through DQn. Other types of memory devices may have separate lines for the data in function (D) and the data out function (Q). Finally, control signals are exchanged between the Data Out Buffers and the read/write control on control lines 54.

Figure 1B:
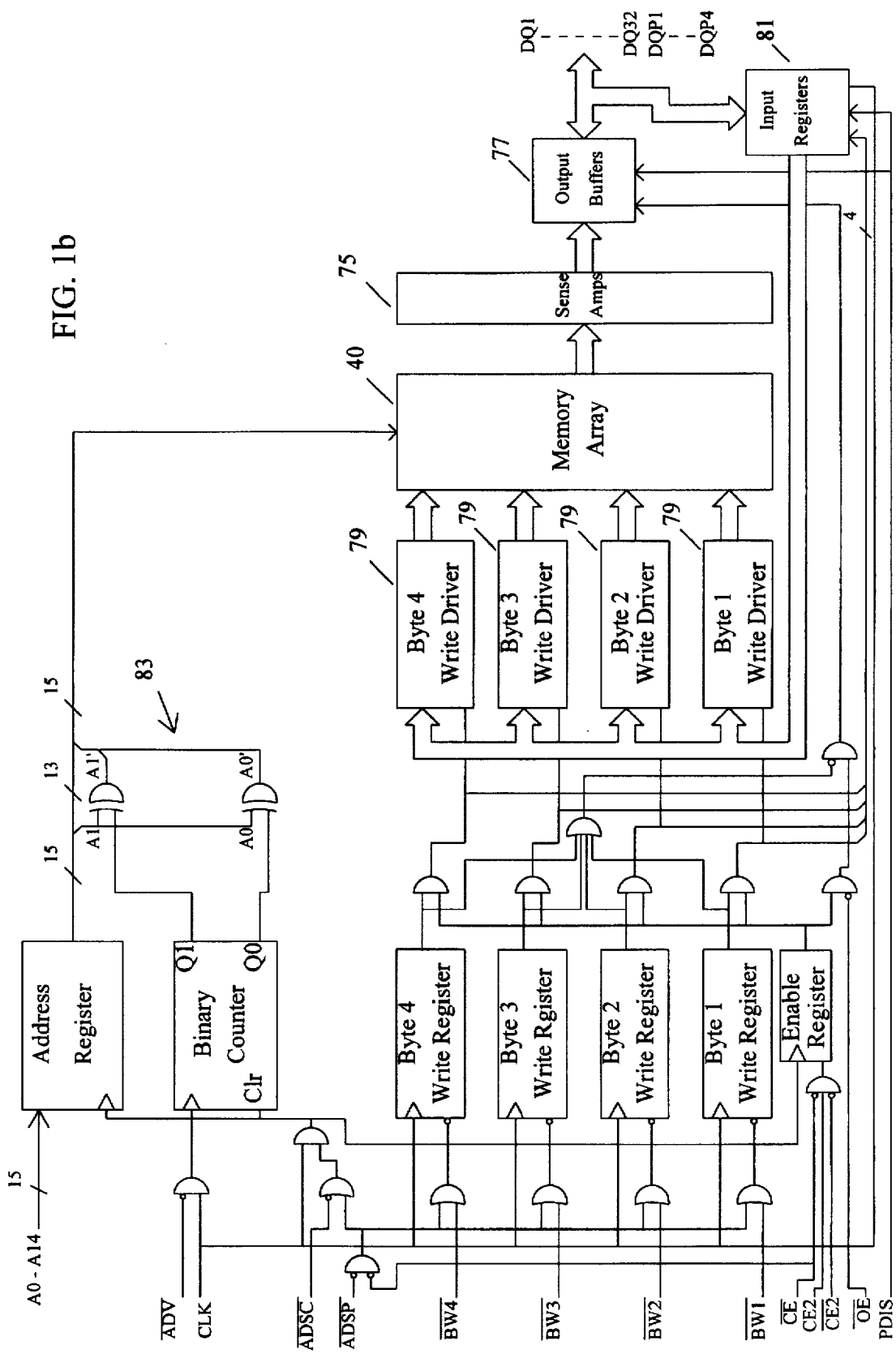
FIG. 1b is a functional block diagram of a random access memory device employing parity bits.

FIG. 1b illustrates another type of memory device 73 with which the present invention may be practiced. A memory array 40 is serviced by sense amplifiers 75, which are connected to an output buffer 77. A plurality of write drivers 79 are provided for writing information to the memory array 40. Information to be written by the write drivers 79 may be held in input register 81. A plurality of registers, counters, and gates form a control circuit 83 which controls the flow of information into and out of memory array 40 in a known manner.

Figure 2:
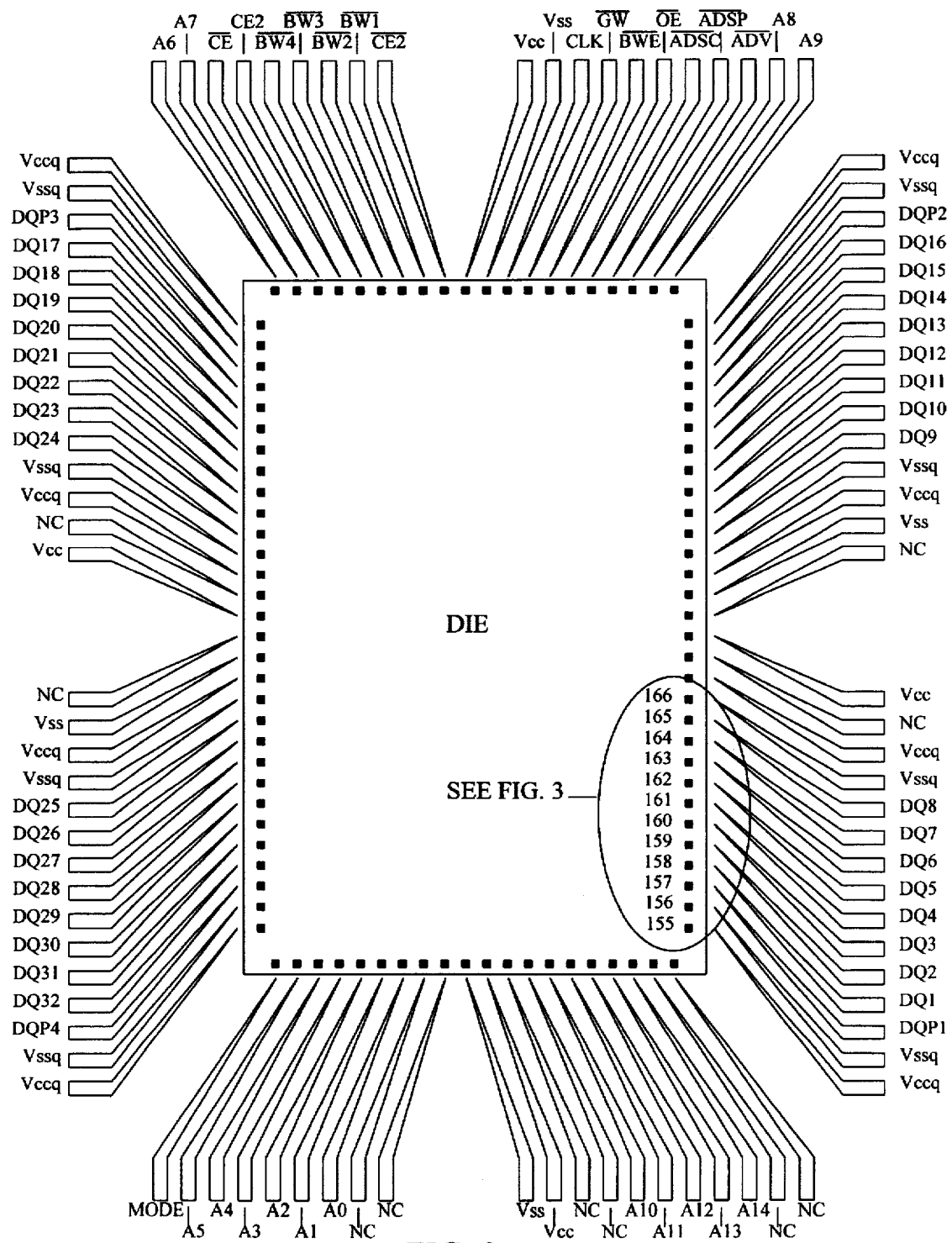
FIG. 2 illustrates how the terminals of the random access memory device of FIG. 1b are connected to a lead frame.
Figure 3:
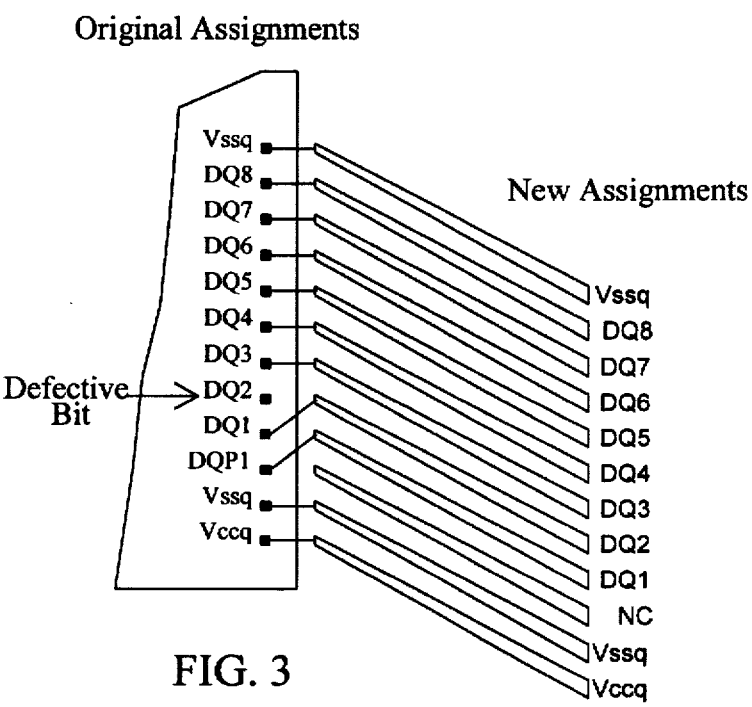
FIG. 3 is a closeup of a portion of FIG. 2 illustrating how the method of the present invention may be employed to improve product yields.

Turning now to FIGS. 2 and 3, an example of how the method of the present invention may be carried out with respect to the device of FIG. 1b for connecting the outputs DQ1–DQ32 and DQP1–DQP4 to a lead frame is illustrated. In FIG. 2, focusing on the area in FIG. 2 within the oval, the following table illustrates the pad assignments:

| Pad No. | Assignment |
|---|---|
| 155 | Vccq |
| 156 | Vssq |
| 157 | DQP1 |
| 158 | DQ1 |
| 159 | DQ2 |
| 160 | DQ3 |
| 161 | DQ4 |
| 162 | DQ5 |
| 163 | DQ6 |
| 164 | DQ7 |
| 165 | DQ8 |
| 166 | Vssq |

After testing the data and parity bits, assume that it is found that the bit connected to pad labelled DQ2 is defective.

Referring now to FIG. 3, the lower right-hand portion of the die within the oval of FIG. 2 is shown in closeup to show how the parity bit DQP1 is used to replace a defective bit DQ2. In FIG. 3, the original assignments for the pads are shown on the die whereas the new assignments for the input/output lead lines are shown on the right-hand portion of the figure. It is seen from FIG. 3 that the pads Vccq and Vssq are connected to the same lead lines Vccq and Vssq, respectively, as before. However, the lead line previously labeled DQP1 now becomes a no-connect (NC). The pad DQP1 is now connected to the lead line labeled DQ1. The pad originally labeled DQ1 is now connected to the lead line labeled DQ2. The pad originally labeled DQ2 has been found to be connected to a defective bit and is therefore not connected to a lead line. The pad originally labeled DQ3 is still connected to lead line DQ3. The remainder of the pads above the pad DQ2 all retain the same assignment as in FIG. 2. In that manner, the defective data bit connected to the bit DQ2 is replaced by the parity bit, and the lead line previously associated with the parity bit is not connected to a pad. Thus, the memory device connected to the lead frame shown in FIG. 2 may still be used as a non-parity or non-ECC device, thereby increasing the yield of such devices.

If no parity/ECC bits are available, a 36-bit wide SRAM can default to a 32-bit wide SRAM if the preset invention is used to repair defective data bits. Other defaults are possible dependant on the bit width of the original device.

Figure 4:
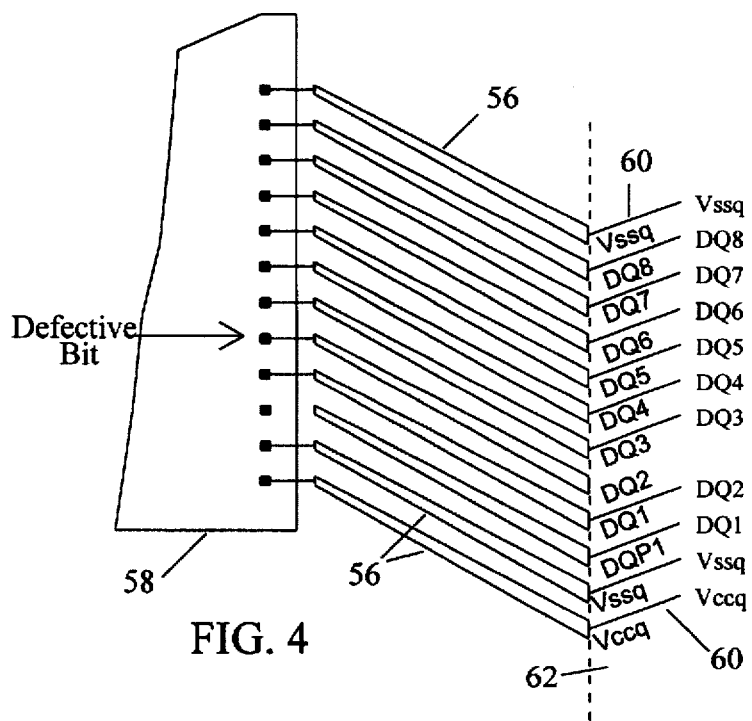
FIG. 4 is a closeup of a portion of FIG. 2 illustrating how the method of the present invention may be carried out through the routing of connections on a printed circuit board.

An alternative embodiment for carrying out the method of the present invention is illustrated in FIG. 4. In FIG. 4, it is assumed that the lead lines 56 are connected to the pads according to the teachings of the prior art such that the defective DQ2 pad is connected to a lead line 56. Notwithstanding the inoperability of the bits connected to the DQ2 lead line, which is determined after conducting standard memory tests, the memory device 58 may still be rendered operational by appropriate routing of conductors 60 on printed circuit board 62. As is seen in FIG. 4, the conductor connected to lead line DQP1 becomes the DQ1 conductor whereas the conductor connected to the lead line labeled DQ1 becomes the line for DQ2. No conductor is connected to the lead line for DQ2 as that bit is nonfunctional. Thereafter, the remaining lead lines are connected to the remaining conductors in a conventional manner. Thus, the operational non-data bit DQP1 is used as a substitute data bit.

Figure 5:
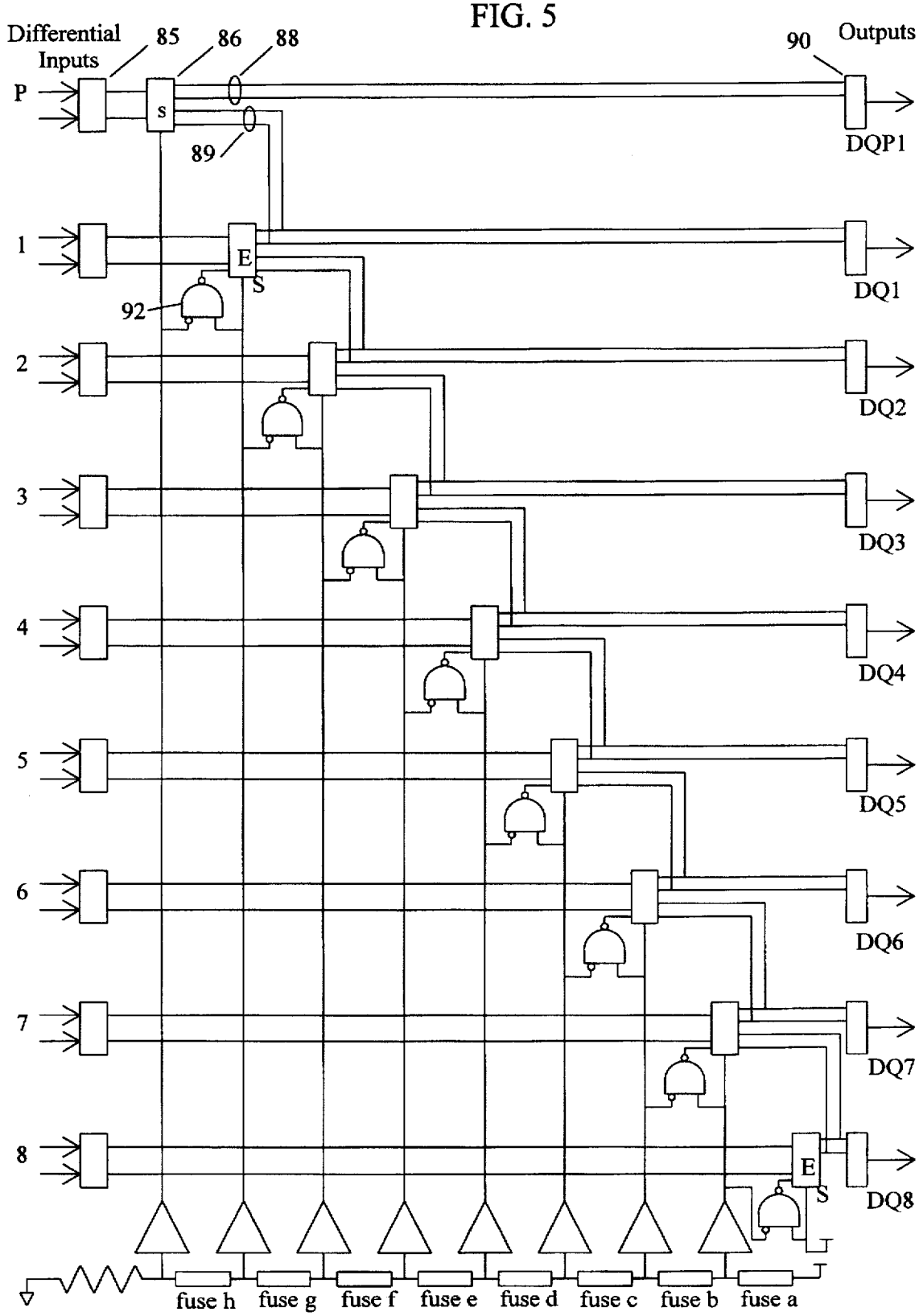
FIG. 5 illustrates how the method of the present invention may be carried out at the sense amplifiers.

Regarding FIGS. 5, 6, 7, and 8a–8i, there are many ways of providing the necessary pathways to enable the extra bits to be used as redundancy. A preferred way, described in detail in conjunction with FIG. 5, is to provide sense amplifiers that have two output pathways. Fuses or anti-fuses are used to enable circuitry within the final sense amplifier stage to select which of the two sense amplifier output pathways is to be used. The sense amplifier is the actual routing device, with the fuse or the anti-fuse enabling which pathway is selected. In that embodiment, the fuse or anti-fuse itself is not the actual pathway. Electrically, that implementation has the least impact on the speed of the memory device.

Other embodiments include the use of circuitry elsewhere downstream of the sense amplifiers to perform the routing as enabled by fuses or an output buffers, see, multiplexers in output buffers, used in conjunction with fuses or anti-fuses, can enable the multiplexers to bypass inoperative memory cells. Additionally, fuses or anti-fuses could be placed in series with the signal path as a direct means for propagating the signals as described in conjunction with FIGS. 6, 7, and 8a–8i.

Turning to FIG. 5, each sense amplifier is made up of a first amplifier stage 85 and a second amplifier stage 86. The first amplifier stages 85 receive differential inputs from the cell representative of the parity bit and the cells representative of bits 1 through 8. The second amplifier stage 86 produces two pair 88, 89 of differential outputs. Each of the operational amplifiers have output circuitry 90 which is responsive to one of the two pairs of differential outputs.

The second amplification stage 86 of each sense amplifier has a select terminal S and an enable terminal E. A series connection of fuses, fuse a through fuse h, is connected across a voltage source and ground. The select terminal S of each output stage 86 is responsive to a voltage produced by the series connected fuses. The enable terminal E of each of the second amplification stages 86, with the exception of the second amplification stage 86 for the sense amplifier responsive to the parity bit, is controlled by a NAND gate 92. Each NAND gate 92 is responsive to the inverse of the select signal input to the previous amplifier's second amplification stage 86 and to its own select signal.

Assume there is a defect somewhere in the chain of the differential inputs for data cell 5. That means that the differential inputs for the parity bit must be routed to DQ1, the differential inputs for bit 1 must be routed to DQ2, the differential inputs for bit 2 must be routed to DQ3, the differential inputs for bit 3 must be routed to DQ4, and the differential inputs for bit 4 must be routed to DQ5. The differential inputs for bit 6 may stay routed to DQ6, the differential inputs for bit 7 may stay routed to DQ7, and the differential inputs for bit 8 may stay routed to DQ8. That configuration is achieved by blowing fuse d in FIG. 5 as explained below.

As shown in the figure, each sense amplifier's second amplification stage 86 has a differential output selectable between output pairs 88 and 89. The upper output pair 88 is active when the input on the select terminal S is logic 1, and the lower output pair 89 is active when the input on the select terminal S is logic 0. When the enable terminal E receives a logic 1, whichever output pair is selected is active. When the enable terminal E receives a logic 0, neither output pair is active.

Normally all fuses are not blown such that they all have a very low resistance. When a fuse is blown, the resistance is very high and viewed as an open circuit. When fuse d is blown, the second amplification stage 86 for the sense amplifier responsive to the parity bit sees logic 0 on its select terminal S causing the output to route to the lower output pair 89 which is connected to DQ1. The second amplification stage 86 of the sense amplifier responsive to the first bit sees a logic 1 on its enable terminal E and a logic 0 on its select terminal S thereby causing its lower pair of differential outputs, which are connected to DQ2, to be operative. The same logic applies until you reach the sense amplifier associated with bit 5. The second amplification stage 86 for that sense amplifier sees a logic 1 at its select terminal S and a logic 0 at its enable terminal E. Therefore, its output is disabled. The sense amplifier for bit 6 sees a logic 1 on its select terminal S and a logic 1 on its enable terminal E therefore causing its upper pair of differential outputs 88, which are connected to DQ6, to be operative. Likewise, the sense amplifier associated with bit 7 and the sense amplifier associated with bit 8 are similarly connected to DQ7 in DQ8, respectively. In that manner, a chain of fuses causes appropriate routing to be selected by blowing one fuse.

Figure 6:
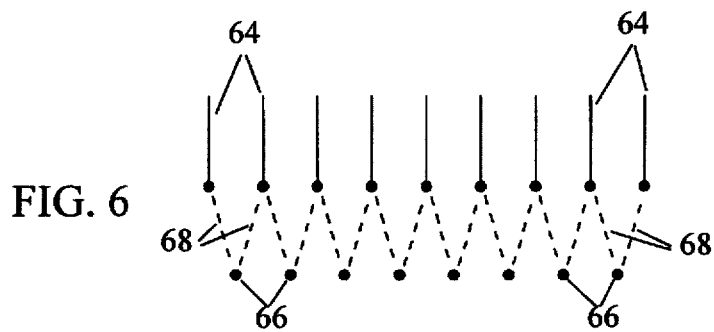
FIGS. 6 and 7 graphically illustrate repair routing capabilities for a single group of nine output pins and two groups of nine output pins, using fusible links, respectively.
Figure 7:
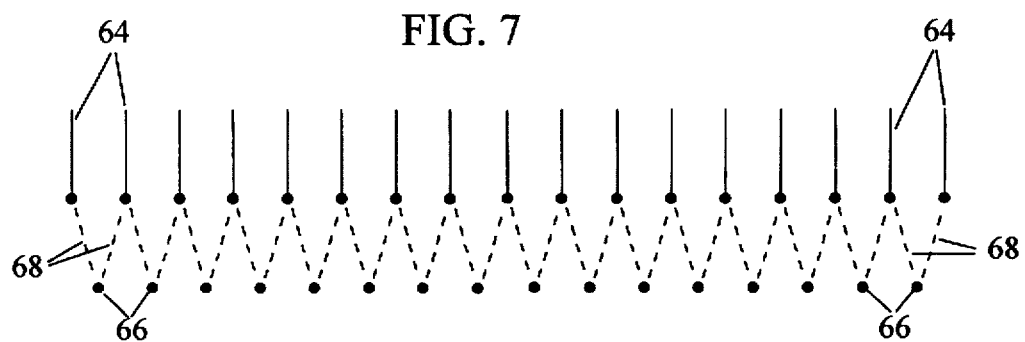

There are many other equally advantages ways of implementing the concept of the present invention. Illustrated in FIG. 6 is a plurality of input/output lines 64. The input/output lines 64 are connected to a plurality of input/output pads 66 through a plurality of fusible links 68. It is seen in FIG. 6 that each pad 66 is connected to two input/output lines 64 illustrated in FIG. 6 is a single group of nine input/output lines. The same concept is illustrated in FIG. 7 which illustrates two groups of nine input/output lines 64.

It is anticipated that when the method of the present invention is carried out, the operative and inoperative bits within the memory device will be identified. Thereafter, the fusible links 68 will be opened in a manner to facilitate operation of the memory device. Illustrated in FIGS. 8a–8i are the final configurations after the fusible links 68 have been opened for each of nine different type of bit failures. Anti-fuses could also be used.

While the preset invention has been described in connection with the preferred embodiments thereof, those of ordinary skill in the art will recognize that many modifications and variations are possible. The foregoing description and the following claims are intended to cover all such modifications are variations.

What I claimed is:

1. A method of using non-data bits of a memory device as data bits, comprising the steps of:
   determining which bits in the memory device are non-functional and which bits are functional; and
   physically connecting the non-data bits to lead lines assigned to data bits.

2. The method of claim 1 wherein said step of physically connecting the non-data bits includes the step of physically connecting error check and correction bits to lead lines assigned to data bits.

3. The method of claim 1 wherein said step of physically connecting the non-data bits includes the step of physically connecting parity bits to lead lines assigned to data bits.

4. The method of claim 1 including the step of bonding the memory device to a lead frame and wherein said step of physically connecting the non-data bits to lead lines assigned to data bits is performed during said bonding step.

5. The method of claim 1 wherein said step of physically connecting the non-data bits includes the step of forming a physical connection by selecting which fusible links to open.

6. The method of claim 1 wherein said step of physically connecting the non-data bits includes the step of forming a physical connection by selecting which anti-fuses to close.

7. The method of claim 1 wherein said step of physically connecting the non-data bits includes the step of forming a physical connection in an output stage of a sense amplifier.

8. The method of claim 1 wherein said step of connecting the non-data bits includes the step of forming a connection after a sense amplifier.

9. A method of using non-data bits of a memory device as data bits, comprising the steps of:

connecting the non-data and data bits to lead lines;

determining which bits in the memory device are non-functional and which bits are functional; and physically routing the connections on a printed circuit board on which said memory device is mounted to said lead lines such that operative non-data bits are used instead of inoperative data bits.

10. The method of claim 9 wherein said physically routing step includes the step of physically routing the connections such that operative error check and correction bits are used instead of inoperative data bits.

11. The method of claim 9 wherein said physically routing step includes the step of physically routing the connections such that operative error check and correction bits are used instead of inoperative data bits.

12. A method of using functional data bits of a memory device to replace non-functional data bits of the same device, comprising the steps of:

determining which bits in the memory device are non-functional and which bits are functional; and physically connecting the functional data bits to lead lines assigned to the data bits while leaving non-functional data bits unconnected thereby decreasing the bit width of the device.

13. The method of claim 12 wherein said step of physically connecting the functional data bits includes the step of forming a physical connection by selecting which fusible links to open.

14. The method of claim 12 wherein said step of physically connecting the functional data bits includes the step of forming a physical connection by selecting which anti-fuses to close.

15. The method of claim 12 wherein said step of physically connecting the functional data bits includes the step of forming a physical connection in an output stage of a sense amplifier.

16. The method of claim 12 wherein said step of physically connecting the functional data bits includes the step of forming a physical connection after a sense amplifier.

17. A memory device, comprising:

an array of memory cells including data and non-data cells;

an input/output data bus comprised of a plurality of input/output lines;

input support logic responsive to said input/output data bus for controlling the writing of data into said array of memory cells;

output support logic responsive to said array of memory cells for reading information out of said array of memory cells onto said input/output data bus; and a connection device for establishing a plurality of physical paths within said output support logic between said array of cells and said input/output lines whereby said non-data cells may be used in place of said data cells.

18. The memory device of claim 17 wherein said output support logic includes sense amplifiers responsive to said array of cells and wherein said connection device includes fusible links within said sense amplifiers.

19. The memory device of claim 17 wherein said output support logic includes sense amplifiers responsive to said array of cells and wherein said connection device includes anti-fuses within said sense amplifiers.

20. The memory device of claim 17 wherein said output support logic includes sense amplifiers responsive to said array of cells and wherein said connection device includes fusible links after said sense amplifiers.

21. The memory device of claim 17 wherein said output support logic includes sense amplifiers responsive to said array of cells and wherein said connection device includes anti-fuses after said sense amplifiers.

* * * * *